United States Patent
Kraft

(10) Patent No.: US 8,409,990 B2
(45) Date of Patent: Apr. 2, 2013

(54) CHEMICAL-MECHANICAL POLISHING COMPOSITIONS AND METHODS OF MAKING AND USING THE SAME

(75) Inventor: Bradley M. Kraft, Fairport, NY (US)

(73) Assignee: Ferro Corporation, Cleveland, OH (US)

( * ) Notice: Subject to any disclaimer, the term of this patent is extended or adjusted under 35 U.S.C. 154(b) by 320 days.

(21) Appl. No.: 12/673,834

(22) PCT Filed: Aug. 25, 2009

(86) PCT No.: PCT/US2009/054824
§ 371 (c)(1),
(2), (4) Date: Mar. 25, 2010

(87) PCT Pub. No.: WO2010/030499
PCT Pub. Date: Mar. 18, 2010

(65) Prior Publication Data
US 2011/0223764 A1  Sep. 15, 2011

Related U.S. Application Data

(60) Provisional application No. 61/096,380, filed on Sep. 12, 2008.

(51) Int. Cl.
*H01L 21/302* (2006.01)
*H01L 21/461* (2006.01)

(52) U.S. Cl. ........ 438/689; 438/690; 438/691; 438/692; 438/693; 51/307; 51/308; 51/309

(58) Field of Classification Search .................. None
See application file for complete search history.

(56) References Cited

U.S. PATENT DOCUMENTS

| 6,569,349 | B1 | 5/2003 | Wang et al. | |
|---|---|---|---|---|
| 6,786,945 | B2 | 9/2004 | Machii et al. | |
| 7,091,164 | B2 * | 8/2006 | Srinivasan et al. | 510/175 |
| 2004/0065022 | A1 * | 4/2004 | Machii et al. | 51/309 |
| 2007/0181534 | A1 | 8/2007 | Kamimura | |
| 2008/0026583 | A1 * | 1/2008 | Hardy et al. | 438/693 |

FOREIGN PATENT DOCUMENTS

| EP | 1369906 A1 | 12/2003 |
|---|---|---|
| WO | 2008/072207 A1 | 6/2008 |

OTHER PUBLICATIONS

Extended European Search Report, dated Nov. 18, 2011, Application No. 09813441.4-1218/2321378 PCT/US2009054824; Applicant: Ferro Corporation; seven pages.
International Search Report for corresponding PCT/US09/54824 mailed Oct. 13, 2009, one page.

* cited by examiner

*Primary Examiner* — Duy Deo
(74) *Attorney, Agent, or Firm* — Rankin, Hill & Clark LLP

(57) ABSTRACT

The present invention provides an aqueous CMP slurry composition that includes abrasive particles and from about 0.01% to the limit of solubility in water of a compound according to Formula (I):

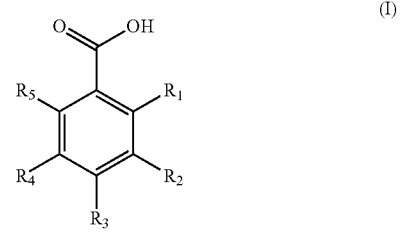

wherein only one of $R_1, R_2, R_3, R_4$ and $R_5$ is a hydroxyl group (—OH), only one of $R_1, R_2, R_3, R_4$ and $R_5$ is a methoxy group (—OCH$_3$), and the three of $R_1, R_2, R_3, R_4$ and $R_5$ that are not either a hydroxyl group (—OH) or a methoxy group (—OCH$_3$) are hydrogen atoms (—H).

14 Claims, No Drawings

CHEMICAL-MECHANICAL POLISHING COMPOSITIONS AND METHODS OF MAKING AND USING THE SAME

BACKGROUND OF INVENTION

1. Field of Invention

The present invention relates to chemical-mechanical polishing ("CMP") compositions and methods of making and using the same.

2. Description of Related Art

CMP is a technology that has its roots in the pre-industrial era. In recent years, CMP has become the technology of choice among semiconductor chip fabricators to planarize the surface of semiconductor chips as circuit pattern layers are laid down. CMP technology is well-known, and is typically accomplished using a polishing pad and a polishing slurry composition that contains a chemical reagent and abrasive particles. The chemical reagent functions to chemically react with one or more materials on the surface of the layer being polished whereas the abrasive particles perform a mechanical grinding function.

One of the uses of CMP technology is in the manufacture of shallow trench isolation (STI) structures in integrated circuits formed on semiconductor chips or wafers such as silicon. The purpose of an STI structure is to isolate discrete device elements (e.g., transistors) in a given pattern layer to prevent current leakage from occurring between them. Recent technological advancements that facilitate the fabrication of very small, high density circuit patterns on integrated circuits have placed higher demands on isolation structures.

An STI structure is usually formed by thermally growing an oxide layer on a silicon substrate and then depositing a silicon nitride layer on the thermally grown oxide layer. After deposition of the silicon nitride layer, a shallow trench is formed through the silicon nitride layer, the thermally grown oxide layer and partially through the silicon substrate using, for example, any of the well known photolithography masking and etching processes. A layer of a dielectric material such as silicon dioxide is then typically deposited using a chemical vapor deposition process to completely fill the trench and cover the silicon nitride layer. Next, a CMP process is used to remove that portion of the silicon dioxide layer that overlies or covers the silicon nitride layer and to planarize the entire surface of the workpiece. The silicon nitride layer is intended to function as a polishing stop that protects the underlying thermally grown oxide layer and silicon substrate from being exposed during CMP processing. In some applications, the silicon nitride layer is later removed by, for example, dipping the article in a hot phosphoric acid solution, leaving only the silicon dioxide filled trench to serve as an STI structure. Additional processing is usually then performed to form polysilicon gate structures.

It should be readily apparent that during the CMP step of manufacturing an STI structure on a silicon semiconductor substrate, it would be highly advantageous to use a polishing agent that is capable of selectively removing silicon dioxide in preference to silicon nitride, which is used as the stop layer. Ideally, the rate at which silicon nitride is removed by CMP would be nil, whereas the rate at which the silicon dioxide overlying the silicon nitride stop layer is removed by CMP would be very high. This would allow high manufacturing throughput. The term "selectivity" is used to describe the ratio of the rate at which silicon dioxide is removed to the rate at which silicon nitride is removed by the same polishing agent during a CMP process. Selectivity is determined by dividing the rate at which the silicon dioxide film is removed (usually expressed in terms of Å/min) by the rate at which the silicon nitride film is removed.

It is known that the removal rate of the silicon dioxide trench fill material can be made to be quite high by varying polishing conditions such as increasing pad pressure and using larger abrasive particles in the slurry. However, these polishing conditions also tend to increase the silicon nitride removal rate, which can affect the uniformity of the final silicon nitride layer thickness and can cause other defects, such as scratching, in the final product. Thus, it is important for a CMP slurry composition to promote a reasonable silicon dioxide removal rate while, at the same time, inhibiting or suppressing the rate of silicon nitride removal. This too, however, must be done in moderation for some applications. When the selectivity of a CMP slurry is too high coupled with a very low silicon nitride removal rate, other problems such as "dishing" of the trench silicon dioxide can occur, which can result in severe topography variations once the silicon nitride stop layer is removed. Thus, a CMP slurry composition needs to be able to balance these factors in order to be useful in STI processing.

In the past, polyacrylates and certain amino acids have been added to CMP slurry compositions to obtain highly selective polishing of silicon dioxide in preference to silicon nitride. In most prior art CMP slurry compositions that employ these additives, as more of the additive is added, both the silicon dioxide and silicon nitride removal rate decreases. This can be problematic in some instances where removal rate on silicon dioxide is too slow, thereby decreasing manufacturing throughput on shallow trench isolation (STI) structures.

BRIEF SUMMARY OF THE INVENTION

The present invention provides an aqueous CMP slurry composition that comprises abrasive particles and a compound according to Formula I:

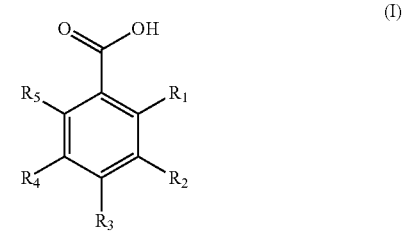

wherein only one of $R_1$, $R_2$, $R_3$, $R_4$ and $R_5$ is a hydroxyl group (—OH), only one of $R_1$, $R_2$, $R_3$, $R_4$ and $R_5$ is a methoxy group (—OCH$_3$), and the three of $R_1$, $R_2$, $R_3$, $R_4$ and $R_5$ that are not either a hydroxyl group (—OH) or a methoxy group (—OCH$_3$) are hydrogen atoms (—H). The presently most-preferred abrasive particles for use in the invention are cerium oxide (sometimes referred to herein as "ceria") and the presently most-preferred compound according to Formula I for use in the invention is vanillic acid. Vanillic acid significantly increases the removal rate of silicon dioxide.

The present invention also provides a method for removing silicon dioxide from the surface of a workpiece by CMP that comprises: (1) providing an aqueous CMP slurry composition between a polishing pad and the workpiece, wherein the aqueous CMP slurry composition comprises abrasive particles and a compound according to Formula I; and (2) pressing the polishing pad and the workpiece together with the CMP slurry composition disposed therebetween while the polishing pad and the workpiece are moving relative to each other to remove silicon dioxide from the surface of the workpiece. In a preferred embodiment of the invention, the CMP slurry composition further comprises a silicon nitride removal rate suppressing additive such as proline, for example.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

In one embodiment, the present invention provides CMP slurry compositions and methods that facilitate the removal of silicon dioxide in preference to silicon nitride via chemical-mechanical polishing during semiconductor device fabrication. The term "silicon dioxide" refers to any deposit having predominantly the structure of $SiO_2$, which may have been deposited or formed by any means including, but not limited to, thermally grown silicon dioxide and tetraethyl orthosilicate ("TEOS").

CMP slurry compositions according to the invention can be used in a variety of applications where silicon dioxide needs to be removed or planarized. Examples include the manufacture of STI structures, Inter-level Dielectric (ILD) polishing and in the fabrication of Micro Electro Mechanical Systems (MEMS) devices.

CMP slurry compositions according to the invention comprise aqueous dispersions of abrasive particles and a compound according to Formula I:

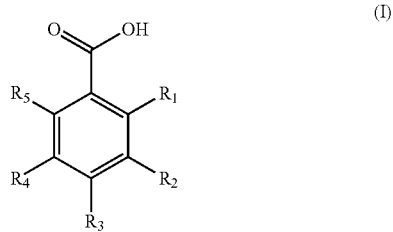

(I)

wherein only one of $R_1$, $R_2$, $R_3$, $R_4$ and $R_5$ is a hydroxyl group (—OH), only one of $R_1$, $R_2$, $R_3$, $R_4$ and $R_5$ is a methoxy group (—OCH$_3$), and the three of $R_1$, $R_2$, $R_3$, $R_4$ and $R_5$ that are not either a hydroxyl group (—OH) or a methoxy group (—OCH$_3$) are hydrogen atoms (—H). The amount of the compound according to Formula I present in the composition is preferably from about 0.01% by weight up to its limit of solubility in water, and most preferably about 0.05% by weight of the slurry composition. The compound according to Formula I performs a function of increasing the removal rate of silicon dioxide during polishing.

The presently most preferred compound according to Formula I is vanillic acid, which has a structure as shown below:

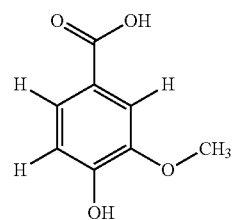

Vanillic acid typically has a limit of solubility in water of about 0.12% by weight of the slurry. Applicants believe that other compounds according to Formula I would likely also increase the removal rate of silicon dioxide during polishing. Such compounds include, but are not limited to, isovanillic acid and 2-hydroxy-X-methoxy benzoic acid (where X is 3, 4, 5 or 6). Vanillic acid is presently most preferred in view of its performance, availability and lack of toxicity. Vanillic acid is a solid, which must be dissolved in water. Applicants have found that it is possible to increase the rate at which vanillic acid dissolves in water by adding a dissolution promoter such as isopropyl alcohol to the water before the vanillic acid is added. The amount of isopropyl alcohol is preferably about 0.15% by weight of the entire slurry composition.

The abrasive particles used in the CMP slurry composition according to the present invention perform the function of mechanical grinding. The presently most-preferred abrasive particles for use in the invention are ceria. However, it may be possible to use other abrasives in addition, or in the alternative. Other abrasives include, for example, alumina, silica, copper oxide, iron oxide, nickel oxide, manganese oxide, silicon carbide, silicon nitride, tin oxide, titania, titanium carbide, tungsten oxide, yttria, zirconia, and combinations thereof.

The preferred ceria abrasive particles preferably have a mean diameter (secondary particle size) ranging from about 20 nm to about 1000 nm, with a maximum diameter of less than about 10,000 nm. If the mean diameter of the abrasive particles is very small, the polishing rate of the CMP slurry composition can be unacceptably low. If the mean diameter of the abrasive particles is large, unacceptable scratching can occur on the surface of the article being polished. Abrasive particles consisting of ceria having a mean diameter within the range of from about 100 nm to less than 500 nm are presently believed to be optimal.

The abrasive particles can be dispersed in water as discrete particles before polishing to form a slurry, which is then disposed between a polishing pad and a surface of a workpiece. Alternatively, the abrasive particles can initially be bonded to the polishing pad, and the CMP slurry composition can be formed in situ by dissociation of the abrasive particles from the polishing pad during polishing of the surface of the workpiece. When dispersed to form an aqueous CMP slurry composition prior to polishing, the abrasive particles are preferably present in the CMP slurry composition in an amount of from about 1.0% to about 8.0%, more preferably from about 2.0% to about 4.0%, or 3.0%, by weight of the CMP slurry composition.

CMP slurry compositions according to the present invention exhibit high silicon dioxide removal rates over a pH range of about 2.8 to about 6. Preferably, the pH of the CMP slurry composition is adjusted within the range of from about 3.0 to about 4.5 using a pH adjusting compound such as nitric acid. It will be appreciated that the pH of the CMP slurry composition be adjusted by the addition of acids and/or bases. Nitric acid is the presently preferred acid for lowering the pH of the CMP slurry composition, and ammonium hydroxide and tetramethylammonium hydroxide are preferred bases for increasing the pH of the CMP slurry composition. It will be appreciated that the selection of a pH adjuster is not critical, and that other acids and bases can be used in the practice of the invention. The CMP slurry composition may also contain optional surfactants, pH buffers, anti-foaming agents, dispersing agents and biocides, which are well known.

As noted, CMP slurry compositions according to the invention can be used to remove and/or planarize silicon dioxide in a variety of applications. When used in ILD and MEMS applications, a CMP slurry composition according to the invention preferably consists essentially of an aqueous dispersion of ceria abrasive particles (preferably about 3.0% by weight), a compound according to Formula I (preferably vanillic acid in an amount of about 0.05% by weight), isopropyl alcohol (preferably about 0.15% by weight), nitric acid (in an amount necessary to lower the pH of the CMP slurry composition to about 3.0 to about 4.5) and a biocide. When used in STI applications (i.e., where silicon nitride is also present), a CMP slurry composition according to the invention preferably consists essentially of an aqueous dispersion of ceria abrasive particles (preferably about 3.0% by weight), a compound according to Formula I (preferably vanillic acid in an amount of about 0.05% by weight), proline (preferably about 2% by weight) isopropyl alcohol (preferably about 0.15% by weight), nitric acid (in an amount necessary to lower the pH of the CMP slurry composition to about 3.0 to about 4.5) and a biocide. It will be appreciated that CMP slurry compositions that include proline can also be used in ILD and MEMS applications. As taught in Srinivasan et al., U.S. RE. 6,491,843 C1, proline suppresses the rate at which silicon nitride is removed relative to the rate at which silicon dioxide is removed in certain CMP slurry compositions. Vanillic acid, when used in the concentrations described herein, does not adversely affect the silicon nitride suppression provided by proline, but does increase the silicon dioxide removal rate. The amount of proline present in such CMP slurry compositions is preferably from about 0.1% to about 10% by weight, and more preferably from about 0.6% to about 4.0% by weight.

Thus, the present invention also provides a method for removing silicon dioxide (e.g., in ILD and MEMS processing) and also a method for removing silicon dioxide in preference to silicon nitride (e.g., in STI processing). Both methods comprise providing a CMP slurry composition as described above between a polishing pad and a surface of the workpiece, and pressing the polishing pad and the surface of the workpiece together with the CMP slurry composition disposed therebetween while the polishing pad and the surface of the workpiece are moving relative to each other to remove silicon dioxide from the surface of the workpiece. When silicon nitride is present on the surface of the workpiece, silicon dioxide is preferably removed at a rate that is greater than 1000 Å/min and at least twenty-five times greater than a rate at which silicon nitride is removed from the surface of the workpiece.

Thus, CMP slurry compositions and methods of the present invention can be used to planarize patterned wafers during the fabrication of semiconductor chips. In such applications, CMP slurry compositions and methods provide benefits over prior art CMP slurry compositions and methods in terms of removal rate, selectivity, field oxide dishing and meeting minimal defectivity requirements. The CMP slurry compositions may also be useful in other polishing applications such as, for example, glass polishing, polishing of organic polymer-based ophthalmic substrates and in metal polishing.

The following examples are intended only to illustrate the invention and should not be construed as imposing limitations upon the claims.

Example 1

Aqueous CMP Slurry Compositions A1 through A8 were prepared by dispersing the components shown in weight percent in Table 1 below in deionized water:

TABLE 1

| Slurry | $CeO_2$ | Vanillic Acid | pH | TEOS RR |
|---|---|---|---|---|
| A1 | 2% | 0% | 4.10 | 2636 |
| A2 | 2% | 0.01% | 3.72 | 5233 |
| A3 | 2% | 0.05% | 3.40 | 6857 |
| A4 | 2% | 0.10% | 3.15 | 6748 |
| A5 | 4% | 0% | 4.13 | 2753 |
| A6 | 4% | 0.01% | 3.59 | 5238 |
| A7 | 4% | 0.05% | 3.10 | 7378 |
| A8 | 4% | 0.10% | 2.98 | 7491 |

The "CeO2" used in each CMP Slurry Composition was a calcined cerium oxide that had a $D_{mean}$ secondary particle size of 130 nm. CMP Slurry Compositions A1 and A5 were controls in that they did not contain any vanillic acid.

CMP Slurry Compositions A1 through A8 were each separately used to polish blanket tetraethyl orthosilicate ("TEOS") films for a period of 60 seconds. The polisher used in each case was an Applied Materials Mirra system. For all test runs, the polishing conditions were 3.0 psi membrane pressure, 3.5 psi retaining ring pressure, 3.0 psi inner tube pressure, 93 rpm head speed and 87 rpm table speed. The flow rate of the CMP Slurry Compositions was 150 ml/min. in each case. The polishing pad used in each case was a Rohm & Haas k-grooved IC1000 pad, with a Suba IV backing. The TEOS removal rate ("RR") in Å/min is set forth in Table 1.

Table 1 shows the effect of polish rates of a blanket TEOS film as a function of concentration of cerium oxide and vanillic acid concentration after polishing for a period of 60 seconds. It can be appreciated that in the absence of vanillic acid, formulations containing 2% and 4% cerium oxide (Dmean=0.13 um) remove TEOS at a rate of ~2600 Å/min and ~2750 Å/min, respectively. In the presence of vanillic acid, TEOS removal rate is 2.5× greater reaching removal rates as high as 7400 Å/min using 4% ceria. Therefore, vanillic acid acts in such a way to increase silicon dioxide removal rate.

Example 2

Aqueous CMP Slurry Compositions B1 and B2 were prepared by dispersing the components shown in weight percent in Table 2 below in deionized water:

TABLE 2

| Slurry | $CeO_2$ | Proline | Vanillic Acid | pH | TEOS RR |
|---|---|---|---|---|---|
| B1 | 3% | 2% | 0% | 4.72 | 3449 |
| B2 | 3% | 2% | 0.05% | 4.20 | 5470 |

The "CeO2" used in each CMP Slurry Composition was the same as used in Example 1. CMP Slurry Composition B1 was a control in that it did not contain any vanillic acid.

CMP Slurry Compositions B1 and B2 were separately used to polish blanket TEOS films for a period of 60 seconds using the equipment and polishing conditions described in Example 1. The TEOS removal rate in Å/min is set forth in Table 2. It can be seen that the presence of proline does not significantly affect the increased removal rate of TEOS provided by the presence of vanillic acid.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed is:

1. An aqueous CMP slurry composition consisting of:
   from about 1.0% to about 8.0% by weight of ceria abrasive particles having a mean diameter of from about 20 nm to about 1000 nm;
   from about 0.01% by weight to the limit of solubility in water of
     vanillic acid;
   an amount of nitric acid sufficient to adjust the pH of the CMP slurry composition to from about 2.8 to about 6;
   from about 0.1% to 10.0% by weight proline; and
   optionally, one or more selected from the group consisting of isopropyl alcohol and a biocide.

2. The aqueous CMP slurry composition according to claim 1 wherein proline is present in an amount of about 0.6% to about 4.0% by weight.

3. The aqueous CMP slurry composition according to claim 1 wherein the CMP slurry composition includes about 0.15% by weight of isopropyl alcohol.

4. The aqueous CMP slurry composition according to claim 1 wherein the aqueous CMP slurry composition has a pH of from about 3.0 to 4.5.

5. The aqueous CMP slurry composition according to claim 1 wherein the ceria abrasive particles have a maximum diameter of less than about 10,000 nm.

6. The aqueous CMP slurry composition according to claim 5 wherein the ceria abrasive particles have a mean diameter of from about 100 nm to about 150 nm.

7. A method for removing silicon dioxide from a surface of a workpiece by chemical-mechanical polishing, the method comprising:
   (i) providing an aqueous CMP slurry composition between a polishing pad and the surface of the workpiece, the aqueous CMP slurry composition consisting of:
     (a) from about 1.0% to about 8.0% by weight of ceria abrasive particles having a mean diameter of from about 20 nm to about 1000 nm,
     (b) from about 0.01% by weight to the limit of solubility in water of
       vanillic acid,
     (c) an amount of nitric acid sufficient to adjust the pH of the CMP slurry composition to from about 2.8 to about 6,
     (d) from about 0.1% to about 10.0% by weight proline, and
     (e) optionally, one or more selected from the group consisting of isopropyl alcohol and a biocide; and
   (ii) pressing the polishing pad and the surface of the workpiece together with the CMP slurry composition disposed therebetween while the polishing pad and the surface of the workpiece are moving relative to each other to abrade silicon dioxide from the surface.

8. The method according to claim 7 wherein the ceria abrasive particles are dispersed in water prior to chemical-mechanical polishing.

9. The method according to claim 7 wherein the ceria abrasive particles are initially bonded to a polishing pad and become dispersed in water during chemical-mechanical polishing.

10. The method according to claim 7 wherein the silicon dioxide is removed from the surface of the workpiece in ILD or MEMS processing.

11. The method according to claim 7 wherein the aqueous CMP slurry composition includes proline in an amount of about 0.6% to about 4.0% by weight.

12. The method according to claim 11 wherein the silicon dioxide is removed from the surface of the workpiece in STI processing in preference to silicon nitride.

13. The method according to claim 7 wherein the ceria abrasive particles have a maximum diameter of less than about 10,000 nm.

14. The method according to claim 7 wherein the ceria abrasive particles have a mean diameter of from about 100 nm to about 150 nm.

* * * * *